(12) United States Patent
Stanescu

(10) Patent No.: US 6,784,802 B1
(45) Date of Patent: Aug. 31, 2004

(54) REAL TIME MONITORING OF CABLE PATCH PANEL

(75) Inventor: Michael D. Stanescu, Beaconsfield (CA)

(73) Assignee: Nordx/CDT, Inc., Quebec (CA)

( * ) Notice: Subject to any disclaimer, the term of this patent is extended or adjusted under 35 U.S.C. 154(b) by 207 days.

(21) Appl. No.: 09/707,081

(22) Filed: Nov. 6, 2000

(Under 37 CFR 1.47)

Related U.S. Application Data

(60) Provisional application No. 60/163,597, filed on Nov. 4, 1999.

(51) Int. Cl.[7] .................. G08B 13/14; G08B 21/00; H01R 3/00
(52) U.S. Cl. ............ 340/687; 340/572.1; 340/686.1; 340/686.2; 340/686.3; 340/686.4; 439/488; 439/489; 439/490; 439/491
(58) Field of Search ................ 340/572.1–572.9, 340/686.1–686.4, 687, 5.8, 5.92; 235/375; 439/38, 43, 151, 133, 488–491

(56) References Cited

U.S. PATENT DOCUMENTS

| | | | | |
|---|---|---|---|---|
| 5,483,467 A | * | 1/1996 | Krupka et al. | 709/200 |
| 5,910,776 A | * | 6/1999 | Black | 340/10.1 |
| 6,517,000 B1 | * | 2/2003 | McAllister et al. | 235/462.01 |

* cited by examiner

Primary Examiner—Jeffery Hofsass
Assistant Examiner—Lam Pham
(74) Attorney, Agent, or Firm—Lowrie, Lando & Anastasi, LLP

(57) ABSTRACT

A system and method for monitoring connectivity in a cable system includes radio frequency identification (RFID) transponders on cable ends and RFID sensors at connection points. The RFID sensors are connected to a central monitoring system. Presence of a particular cable end at a particular connection point is detected and recorded by the central monitoring system.

4 Claims, 2 Drawing Sheets

REAL TIME MONITORING OF CABLE PATCH PANEL

CROSS REFERENCE TO RELATED APPLICATION

This application claims domestic priority under 35 U.S.C. § 119(e) to provisional U.S. patent application serial No. 60/163,597, filed Nov. 4, 1999, pending.

BACKGROUND

1. Field of the Invention

The present invention relates generally to methods and apparatus for monitoring the status of components of a cabling system.

2. Related Art

In modern construction, the telecommunications cabling system is part of many buildings' infrastructure. A building's cabling system should be flexible and adaptable to the needs of the people it serves. Thus, the cabling system is frequently a dynamic, changing entity. In order to facilitate this, some transition points have been added. These points are called "Telecommunications Closets" (TC) and their features and requirements are listed in the standard ANSI/TIA/EIA-569 (CSA T530), entitled "Commercial Building Standards for Telecommunications Pathways and Spaces" in effect on the filing date of this application. The TC is defined as the space that acts as the transition point between a network backbone, usually including one or more servers, routers, etc. and horizontal distribution pathways, going to the work area.

In accordance with the standard mentioned above, there should be at least one TC per 1000 $m^2$ of usable floor space area and additional TC closets should be provided when the floor area exceeds 1000 $m^2$ or the length of horizontal cabling is greater than 90 m. Thus, it is understood that a building can have several TC's, e.g. one per floor.

The standard ANSI/TIA/EIA-568-A (CSA T529-95), entitled "Commercial Building Telecommunications Cabling Standard" in effect on the filing date of this application specifies the requirements for the buildings' cabling structure and topology and gives the definition and the functions of the cross-connect system, which is contained in the TC.

The purpose of the cross-connects is to allow moves, add-ons and changes (MAC) between the common equipment and the work areas.

In order to keep track of the status of the cabling system, all cabling system components must be identified and labeled as specified in ANSI/TIA/EIA-606 (CSA T528) standard, entitled "Administration Standard for Telecommunications Infrastructure of Commercial Buildings" in effect on the filing date of this application. There is a minimum amount of information to be collected, recorded and maintained for each component with required information and linkages to other records.

Without a strict change control process, the cabling administration and management quickly becomes unwieldy, difficult to trace and impossible to document.

Due to an endemic lack of discipline in keeping records on moves, add-ons, changes, troubleshooting becomes costly, time consuming, difficult to plan and often leads to considerable user downtime.

Despite these drawbacks, frames and patch panels provide unparalleled flexibility to quickly routing voice and data services throughout a building and are extremely cost effective compared to other alternatives. Consequently, they are used in the cabling structure for the majority of commercial buildings.

In most cases, the administration records for the cabling structure are kept manually, sometimes using various stand-alone cable management software. Such packages are merely databases of configuration status information, which has been manually entered.

According to another approach, some manufacturers have replaced the frames and patch panels of a typical TC with a real-time online voice and data electronic switching and monitoring system. Some disadvantages of such systems are the prohibitive cost and limitations in performance.

A real time online cable management system monitors and keeps track of MACs, but desktop remote management is not possible without human resources physically making and verifying the MACs onsite. Still, real time status is given to the administrator to confirm the required changes in connectivity have been made. This way, human errors are minimized, but records are still updated manually.

Previous attempts to automatically monitor the "passive" condition of a cabling system have been hampered by non-standard, proprietary designs and network performance degradation and interference issues.

One product addresses the issue by modifying the patch cord and the jack.

The system is made using the contact between an additional dedicated wire added to the plug, which comes in contact with its counterpart in the jack in order to identify the connection. Both plug and jack are non-standard, proprietary, designs.

The jacks are printed circuit board (PCB) mounted, with several jacks on the PCB board. The PCB serves also for routing the additional wire needed for inductive identification of the connection. Each connection is connected to a rack-monitoring unit through a parallel connection. Software executing in a monitoring unit identifies the connection and using a graphic interface displays information to the administrator who plans all MACs with this aide.

Once all the planned changes are done and validated in the graphic interface, system's visual indicators light up, indicating the connections to be made.

This conventional approach has numerous disadvantages, including:
  Unsuitability for existing installations, it needs non-standard jacks and patch cords;
  Jacks can be only PCB-type using a lead frame with special adaptation;
  Contact needed between jack and plug to indicate configuration information;
  Parallel type connection leads to bulky connectors and hardware.
  One known system comprises the following components:
  Contact sensors that are attached to the exterior of the monitored port, several ports' sensors being attached together using a flexible PCB;
  An external patch cord cable boot with an additional wire which links the two ends of the cord; and
  An electronic scanner that collects connectivity information and reports it to the graphic interface through specialized software.

A common feature of the above mentioned systems is a contact type operation between the port and the plug in order to identify and/or transfer information about the connection.

Another common feature they have is the use of an additional wire to identify the ends belonging to the same patch cord. Only with this feature can the connection be properly identified.

Without these features, the "information loop" about the connection can not be closed and the malfunction of either will cause a failure. In fact, all these systems present the disadvantages of wired technology. Faults in the wire, connectors, or any connection cause erroneous status reports.

SUMMARY OF THE INVENTION

It is a general goal of embodiments of the present invention to provide improved systems and methods for managing connectivity in a cable system.

According to one embodiment of the invention, a system for monitoring pluggable cable connectivity includes an electronic tag proximate a connector of the pluggable cable, an electronic tag reader proximate a mating position to which the connector can connect, and a monitor connected to the electronic tag reader which controls the electronic tag reader and monitors presence of the electronic tag at the electronic tag reader.

BRIEF DESCRIPTION OF THE DRAWINGS

In the drawings, in which like reference designations represent like elements.

DESCRIPTION OF EMBODIMENTS OF THE INVENTION

The invention is now illustrated by the following description of an embodiment and aspects thereof. The described embodiment provides a real time way to identify and manage connectivity in a structured cable system. The technology used is called "Radio Frequency Identification," or simply RFID. RFID is an automatic identification and information acquisition technology and consists of a sensing device, which transmits a radio-frequency signal to a specially designed tag, which responds with another radio message, thus identifying itself to the sensing device with a unique code.

Some advantages of the approach using RFID technology are:

Non-contact operation and wireless identification of both ends belonging to the same patch-cord;

Non-proprietary system that can be installed on existing, conventional cabling components;

Flexible, open architecture can be retrofitted to any existing or new copper and fiber structured cabling networks;

Eliminates clerical errors introduced when recording data while also facilitating faster data collection and a reduction in labor and paperwork to process data;

Lower cost than prior art systems due to wireless technology;

Emulates installer's work by providing step-by-step visual guidance using LED's and Programmable Unit Display to complete the work order;

Will issue a virtual work order and checks its completion, eliminating the paperwork, but still giving an audit trail and time stamping of performed MACs;

Compliant with ANSI/TIA/EIA standards in effect at the date of filing of this application and does not interfere with the signal carried by the cable;

Uses non-volatile memory, hence it is insensitive to power loss;

Expandable, star topology as required for a structured cable network, can yield a total system identification;

Flexibility permits Local or Central management solutions which are a function of customer requirements; and Adaptable—Can be easily interfaced with existing Cable Management Software.

Figure 1:
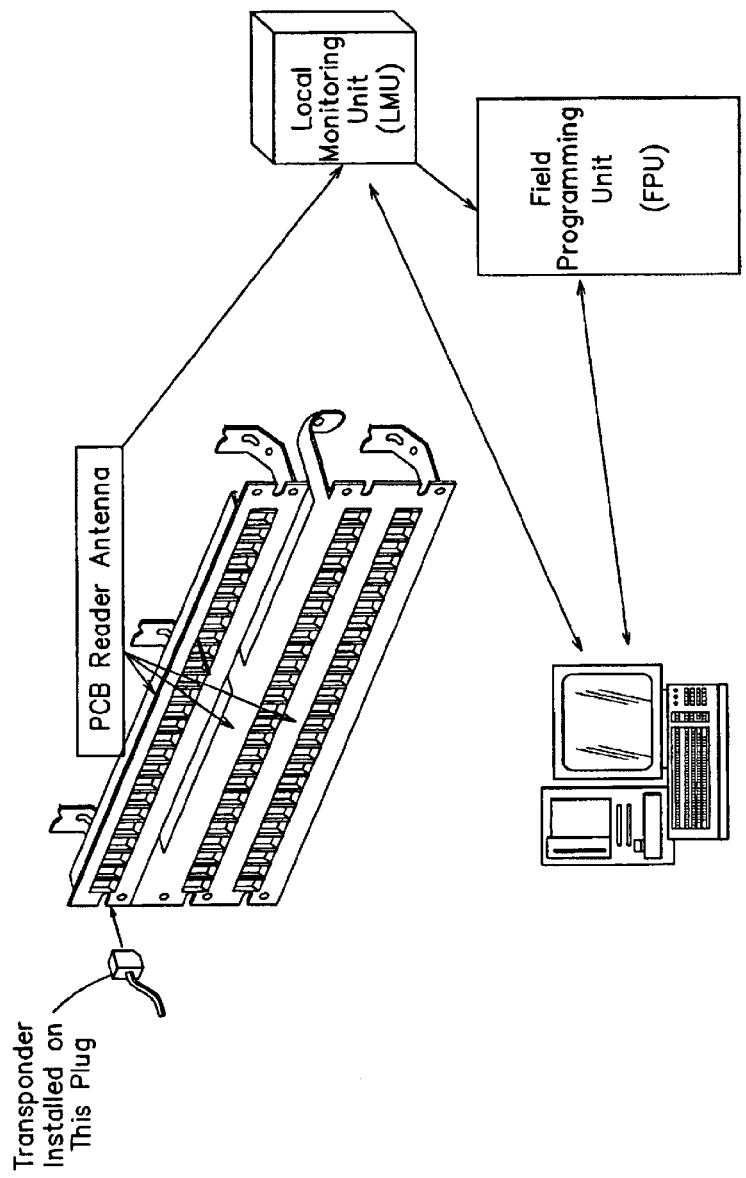
FIG. 1 is a block diagram of a monitoring system according to one aspect of the invention.
Figure 2:
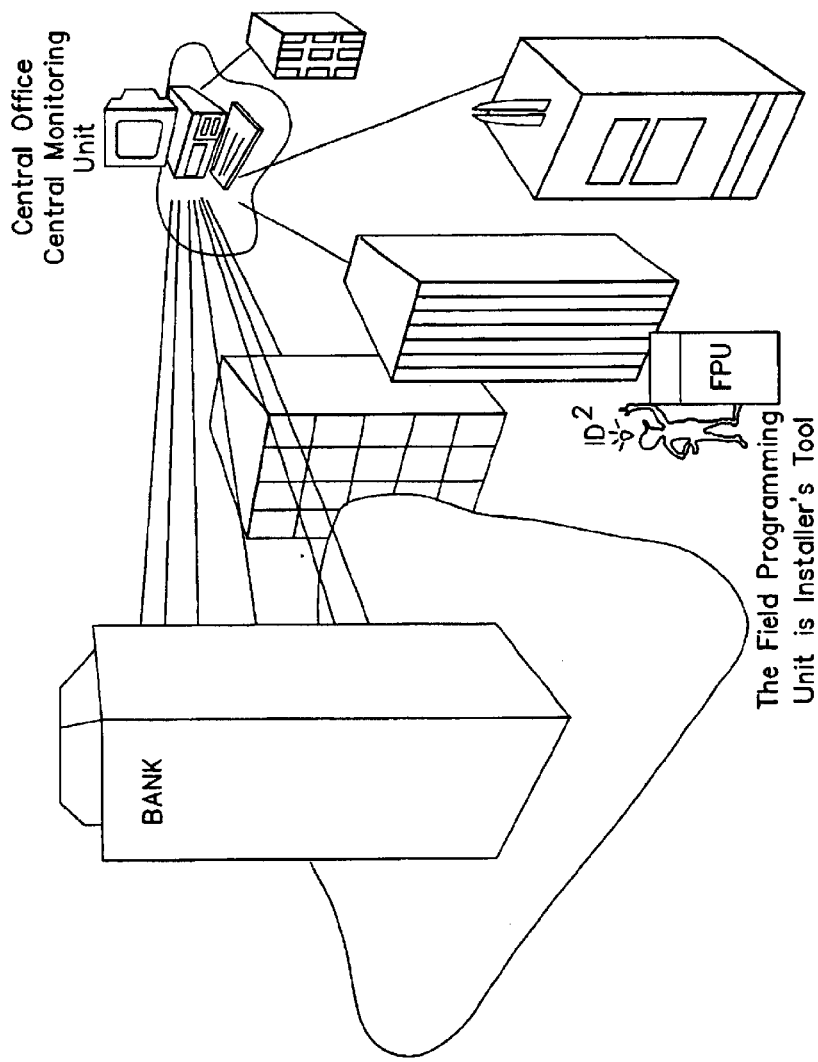
FIG. 2 is a block diagram of a distributed monitoring system according to another aspect of the invention, in which each branch may be a system as shown in FIG. 1.

The Main System Components, shown in FIGS. 1 and 2, are:

Transponders, i.e., electronic tags, attached to each connector of a patch cord;

Transponder reader antenna, i.e., sensing elements, attached to each port and one panel controller for a defined number of ports. (If there is more than one panel per TC or rack, all panel controllers are connected to a closet/rack controller);

Field programmer unit (FPU) which reads and can program transponders in field. (It programs and reads information from panel controllers and closet/rack controller. It carries back to a central monitoring unit, the cabling information collected from the field in small systems only);

Local Monitoring Unit, (LMU) which controls all readers and transponders in a telecom closet (TC) and stores all the desired information about the jacks and their physical location.

Central monitoring unit is located on the server or network administrator's computer and contains the $ID^2$ software (The central monitoring unit exchanges data with the "Field Programmable Unit" (FPU) or with the "Local Monitoring Unit" (LMU), acquires and generates the initial information on the cabling system (cabling project) and transfers it to the FPU or to the LMU's, and receives from the field all the cabling information via the Field Programmer Unit or via the "Local Monitoring Units" (monitoring line, wire or wire-less)).

FIG. 1 schematically illustrates an embodiment of the invention incorporating the above-described elements.

FIG. 2 shows how a system according to FIG. 1 can be distributed across an enterprise or geographic area.

One embodiment of the system is a cross-connect system, including two racks (distribution and equipment), that can be viewed as two matrixes. The rack ports are cross-linked through patch cords. Any port, i.e., jack in the distribution matrix has the ability to be connected with any other in the equipment matrix. MACs produce changes in the cross-connect configuration of the two matrixes.

If any connection point, i.e., jack, of the two matrixes is electronically labeled with an RFID transponder reader or the like, and if both ends of the connecting cord (plugs) are electronically labeled with a corresponding RFID transponder or the like, then, through a real time data collecting and monitoring system, the administrator is able to issue MACs, verify in real time their completion, check, validate and audit trail the connections, even manage assets.

In existing systems, electronic labels can be added to cables, patch panels, etc. In new systems, these labels can be included in the hardware for cost effectiveness.

Upon the initialization of the system, a computer broadcasts signals to each point of the matrix and the tags on the cords are recognized by the port they are installed on, and checked if they match previously input addresses in the mating matrix. If everything matched, the administrator is asked to validate the configuration and the system goes into monitoring mode.

If moves, add-ons or changes (MACs) are needed, the administrator configures them through the graphic interface and issues a virtual (through the Field Programmable Unit) and/or a written work order (print or e-mail) to the field technician.

The technician arriving in the telecom closet (TC) to perform the work order will find visual information about the changes he has to make, for example, an LED showing red or blinking. The visual aids can be made to light sequentially, in the same order the MACs have been programmed by the administrator, thus showing what connection to make, break or change. LED indicators will change from red to green upon the completion of the task sequence, then the next MAC will be highlighted.

Another way to perform MACs is to follow step by step the information on the display of the "Field Programming Unit," which previously has been loaded with the virtual work order.

Increased MAC security can be provided by password protecting the FPU data.

Also, the disclosed system and TC access can be linked with a security access control system for enhanced protection of the cabling system.

If an incorrect configuration is discovered, an alarm is immediately issued to the administrator's PC through specialized software with a graphic interface until a physical change made in the cross-connect corrects the configuration. LEDs attached to each port can be made to blink until all of the connections specified in the work order are correctly made by the technician.

The above description pertains to "Local Mode." The local mode is best suited to small companies or for one building having several TC's.

When several "Local Mode" points are to be linked, e.g. several branches of the same bank located in different areas of the city or in different cities, then the "Central Management Mode" configuration is most suitable. The information is communicated via Ethernet, Internet, etc. to the "Central Monitoring Unit" situated in the Central Office.

Detailed Description of the System Components

The Transponders (Tags)

These are smart labels that contain information, which can be both read and written (modified), through a wireless interface.

One transponder will be attached at each end of the patch cord or cable. They can be embedded (over-molded) in the plugs or their boots, glued or simply wrapped around if incorporated in the form of a label.

They can be programmed at installation, e.g., through the "Local Monitoring Unit" or "Field Programmable Unit," can be factory installed and programmed, and can be used to trace the cords for stock or asset management.

The transponder corresponding to each plug stores information about the cable and the cabling system at its level in the hierarchy.

They can be either mounted on copper or fiber optic patch cords.

Further applications and development of an "end to end" cable configuration monitoring system might require attaching (or embedding) transponders either on the wall outlet jacks or on the user equipment or on the equipment hubs.

The Readers

The readers include miniature antennas attached to each jack. They further include sensors that can be embedded, e.g., over-molded in each jack or can be presented as multiple readers, each reader corresponding to a jack. They can be put together on a PCB, on the same PCB with the jack circuit, mounted above ports on a patch panel or embedded in the patch panel.

The readers corresponding to a patch panel are connected together through a serial interface, for example having 3 wires, and then the cable of each patch panel daisy-chained to the next, the last one going to the "Local Monitoring Unit."

Each reader can also have visual feedback to show the status of the connection, such as a two-color LED, 2 LEDs (red and green), or only one LED.

The Field Programming Unit

This can also be called a transponder programmer, but it will have multiple modes, or functions, like program, learn and download.

It plays the role of the pencil and data sheet in the existing labeling system.

It is a portable unit, battery operated with keyboard, LCD.

It exchanges info with the LMU's or with the CMU via wire or wireless interface.

All field related connectivity information can be downloaded from the administrator's PC (the CMU) to the FPU. This information can then be transferred to the "Local Monitoring Unit" which updates itself (updates readers' information) and updates the information on the corresponding transponders via readers situated on the jacks.

Also, the FPU can transfer to any plug the required information or retrieve information from any plug.

The FPU reads and eventually programs transponders in the field. Thus, quick troubleshooting of the cross-connect system is possible.

The FPU can program and read "Local Monitoring Unit's" information (see schematic in, for example, "Local Mode Configuration").

The FPU can also carry back to a "Central Monitoring Unit," the cabling information collected from the field, for example, confirmation of the work order completion and audit trail.

No more than one FPU is necessary per system.

Local Monitoring Unit

Controls all readers and transponders in a telecom closet (TC).

It plays the role of the TC spreadsheet.

The LMU can update the information on the concerned transponders via readers (antennas) situated on the jacks.

The LMU stores all the desired information about the jacks and their physical location. The LMU contains all jacks' electronic labels.

The LMU further contains and updates the information about the cabling system at TC level in the hierarchy and updates the information on all readers it controls.

The LMU also exchanges information with the "Central Monitoring Unit" via wire or wireless link or via the "Field Programmable Unit."

LMU's can be connected or not (use the FPU for information exchange) to the CMU, function of monitoring system design version.

Several "LMU's" can be daisy-chained together.

At least one LMU is needed per telecom closet (TC).

Central Monitoring Unit

The Central Monitoring Unit includes a piece of software ($ID^2$ CMS-$ID^2$ Cable Management Software) executing on a computer that is linked with our LMU's (hardware) via a wire or wireless interface. $ID^2$ CMS can easily communicate with or be adapted to existing CMS. It can also be made to communicate with other systems, e.g., security. $ID^2$ CMS performs "real-time" information exchange and update. $ID^2$ CMS is installed on administrator's PC or on the company's server. It sends and collects data from all LMU's connected to it, so it has also the functions of a central scanner. It can exchange information with the FPU's via a wire or wireless interface.

The system administrator can monitor and make changes to the current system configuration, using the features and the graphical interface of Cable Management Software adapted to the above-described monitoring hardware.

The system administrator can send a print out or an e-mail of the new configuration to the field technician, which changes the connections. Or, one or more virtual work orders can be directly downloaded into the FPU, and it can audit the FPU for the completion and correctness of the executed work order. The network administrator can monitor the changes in real time.

The initial cabling system configuration information may be received in an ASCII or a CAD file provided by the installer, or by the network designer. The $ID^2$ CMS software may then translate the information into a file compatible with the CMS. Or, information can be manually loaded into the software. Upon system's initialization, this information is then transferred to the LMU's (direct or downloaded from RPU) which scans all the ports and activates them.

Once the scanning is complete, the system goes in monitoring mode.

One "Central Monitoring Unit" driven by the $ID^2$CMS software is used in each system.

The present invention has now been described in connection with a number of specific embodiments thereof. However, numerous modifications, which are contemplated as falling within the scope of the present invention, should now be apparent to those skilled in the art. Therefore, it is intended that the scope of the present invention be limited only by the scope of the properly construed claim appended hereto and equivalents thereof.

What is claimed is:

1. A system for monitoring connections between plural mating positions made by a cable having a connector at each of two ends, comprising:
    an electronic tag proximate each connector of the cable;
    electronic tag readers proximate each of the plural mating positions to which each connector of the cable can connect; and
    a monitor connected to the electronic tag reader, which controls the electronic tag reader, monitors presence of the electronic tag at a particular electronic tag reader, and determines between which of the plural mating positions the cable is connected.

2. The system of claim 1, used in a network, the monitor further comprising:
    a processor executing a sequence of instructions defining:
    creating a database mapping the network resulting from the connections made by the cable as determined by which of the plural mating positions are connected by the cable.

3. The system of claim 2, further comprising instructions executed by the processor of the monitor responsive to inputs specifying a desired change to the network, the instructions defining:
    producing a work order indicating mating positions to which the cable is connected and the work order further indicating mating positions to which the cable should be connected upon execution of the work order.

4. The system of claim 3, further comprising instructions executed by the processor of the monitor responsive to changes in which mating positions are connected by the cable, the instructions defining:
    producing an indication of an unauthorized change to the network.

* * * * *